(12) United States Patent
Lyons et al.

(10) Patent No.: US 6,583,988 B1
(45) Date of Patent: Jun. 24, 2003

(54) ENCAPSULATED POWER SUPPLY

(75) Inventors: Jon H. Lyons, Haddam, CT (US);
James L. Stopa, Old Saybrook, CT (US)

(73) Assignee: Whelen Engineering Company, Inc., Chester, CT (US)

( * ) Notice: Subject to any disclaimer, the term of this patent is extended or adjusted under 35 U.S.C. 154(b) by 0 days.

(21) Appl. No.: 10/072,158

(22) Filed: Feb. 5, 2002

(51) Int. Cl.[7] ................................................. H05K 7/20
(52) U.S. Cl. ........................ 361/719; 361/704; 361/707; 174/252; 165/80.2; 165/185
(58) Field of Search ....................... 361/687, 688–690, 361/704, 707, 709, 714, 717, 718, 719, 720; 174/16.3, 252, 80.3, 185; 257/706, 707, 712, 713, 718, 719, 727

(56) References Cited

U.S. PATENT DOCUMENTS

| | | | |
|---|---|---|---|
| 5,184,283 A | * | 2/1993 | Hamel ........................ 361/736 |
| 5,590,026 A | * | 12/1996 | Warren et al. ............... 361/704 |
| 5,926,373 A | * | 7/1999 | Stevens ....................... 361/704 |
| 5,946,192 A | * | 8/1999 | Ishigami et al. ............. 361/704 |
| 6,222,732 B1 | * | 4/2001 | Jakob et al. ................. 361/704 |
| 6,225,559 B1 | * | 5/2001 | Hubner et al. ............. 174/52.1 |

* cited by examiner

*Primary Examiner*—Boris Chervinsky
(74) *Attorney, Agent, or Firm*—Alix, Yale & Ristas, LLP

(57) ABSTRACT

A power supply for use with an associated light bar assembly suitable for use at a warning light on an emergency vehicle that includes a generally planar printed circuit board having at least one discrete component mounted thereon. A power supply housing surrounds the printed circuit board and includes a generally planar heat sink plate. The heat sink plate is disposed in generally parallel relationship to the printed circuit board and is disposed in thermal conduction relationship with respect to a discrete component. A fastener extends through the discrete component to urge the printed circuit board and the generally planar member together. The discrete component may be a MOSFET.

15 Claims, 5 Drawing Sheets

ENCAPSULATED POWER SUPPLY

BACKGROUND OF THE INVENTION

This invention relates to warning lights such as those used on emergency vehicles to alert others as to the presence of the emergency vehicle. More particularly, the present invention relates to the heat dissipation from the power supply used to operate such lights.

The warning lights may be of conventional design, including strobe lights and halogen lights, or they may be configured in an array of light emitting diode's (LED's) that are used to generate light which, when appropriately directed, has a relatively high intensity. When the LED's of such arrays are energized simultaneously and intermittently, the resulting bursts of light function as effective warning devices for primary emergency vehicles such as fire, rescue, towing, DOT and ambulances as well as other vehicles.

The dissipation of heat from warning lights and the power supplies for such lights must be carefully controlled because the warning lights as well as other solid-state electronic devices used in such assemblies are susceptible to thermal damage. The possibility of damage resulting from overheating is also increased when devices are closely spaced in an array to achieve the illusion of a single source of light. The present invention is focused on the dissipation of heat from the power supply employed for vehicular warning light assemblies. The dissipation of heat from the power supply is a component of the overall design parameters relating to heat dissipation throughout the entire warning light assembly.

The prior art to which the invention relates includes U.S. Pat. No. 5,016,139 entitled "Electronic Power Supply with Enhanced Heat Transfer Characteristics", issued to James L. Stopa and Stephen C. Bibbiani and assigned to the assignee of the present invention. This patent discloses an electronic power supply, which employs energy storage capacitors in an enclosure defining a housing including a base and a cover. The capacitors are resiliently supported within the enclosure on a carrier. Integral receivers extend from the underside of a top cover that are registered with the carrier and engage the capacitors to clamp the capacitors in a fixed position within the housing. The housing exterior includes a thermal radiator comprising multiple fins, which extend outwardly for dissipating heat generated in the capacitors.

The present invention has particular utility in electronic systems that supply power to intermittently operated loads and especially to high intensity light generator loads and has applicability to a wide range of power supplies. A number of electronic power supplies are commercially available that are suitable for use with gas discharge tubes for warning light systems. For example, U.S. Pat. Nos. 4,013,921 and 4,321,507 generally disclose power supply circuitry of the type for which the present invention is applicable. These power supplies employ one or more relatively large electrolytic capacitors which are discharged to flash tubes to provide the power for generating the requisite light output.

Typically, power supply circuitry of the type to which the invention relates is housed in an enclosure which is at least in part defined by a metal or plastic box. The components, which supply the power to the flash tube(s) and/or light emitting diode arrays, occupy a substantial space within the enclosure and, as noted above, generate a significant quantity of heat during the operation of the power supply. The significant heat generated by the components presents a problem in terms of efficiently positioning and mounting the components within the enclosure and for transferring the heat from the vicinity of the components to prevent overheating which could damage or affect the operation of the power supply and/or the arrays of lights.

SUMMARY OF THE INVENTION

An object of the present invention is to provide a power supply for a warning light which is constructed to dissipate a substantial amount of heat and which occupies a relatively small volume.

Another object of the present invention is to provide a compact power supply having an efficient and relatively low cost construction wherein the power supply has the capability of effectively dissipating a substantial amount of heat from the assembly.

A further object of the present invention is to provide a power supply for a vehicular emergency light bar which effectively functions as a structural support module and an effective dissipate of heat.

It has now been found that these and other objects of the invention may be attained in a power supply for a light bar assembly for use as a warning light on an associated emergency vehicle. The power supply has a generally planar printed circuit board mounting at least one discrete component which generates a significant amount of heat. A housing surrounds the printed circuit board and includes a generally planar heat sink plate that is disposed in generally parallel relationship to the generally planar printed circuit board. The generally planar heat sink plate is disposed in thermal conduction relationship with respect to the one discrete component and a fastener extends through the discrete component to urge the printed circuit board and the generally planar member together.

In some forms of the invention, the housing has laterally extending feet and a material may be disposed between the discrete component and the generally planar heat sink plate to improve thermal conduction therebetween. Various forms of the invention may have a threaded fastener extending through the discrete component which may be a MOSFET.

BRIEF DESCRIPTION OF THE DRAWING

The apparatus of the present invention will best be understood by reference to the accompanying drawing in which.

DESCRIPTION OF THE PREFERRED EMBODIMENT

Referring now to FIGS. 1–7, there is shown a warning light assembly or light bar 10 which incorporates two power supplies 20 in accordance with one form of the present invention. Ordinarily, the two power supplies 20 are mounted at opposite, transversely spaced locations for powering various warning lights. Each power supply functions as a structural module for the light bar and is further configured to very efficiently dissipate heat to and from the integrated light bar assembly.

Figure 6:
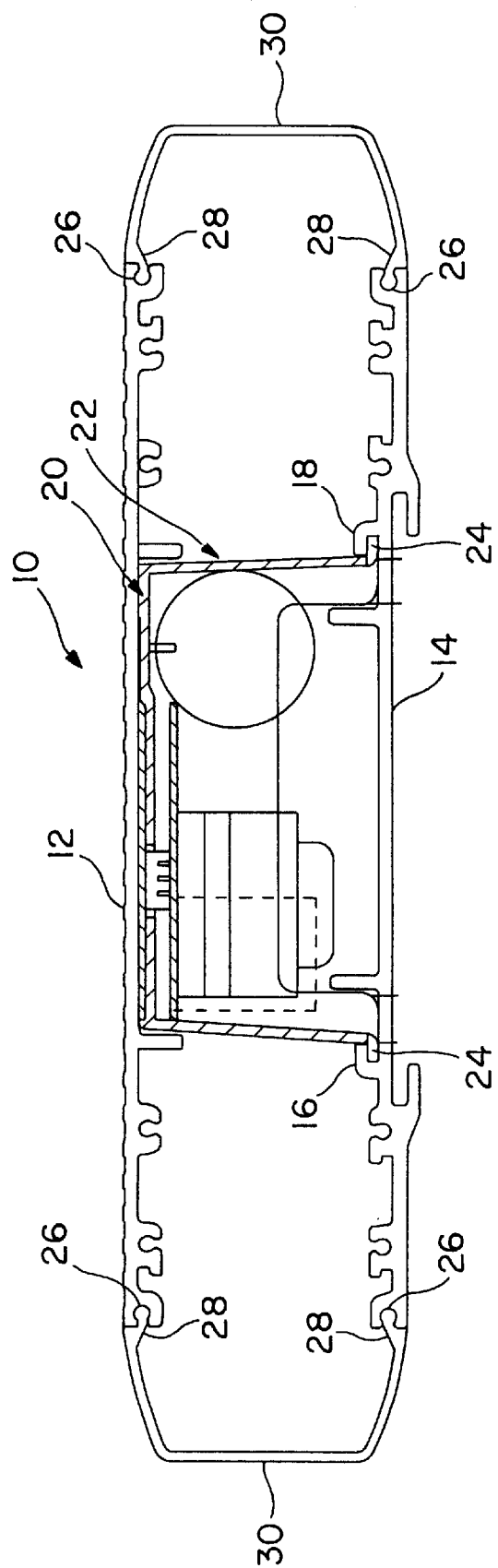
FIG. 6 is a cross-sectional view, partly in phantom, taken along a vertical plane through an elongated emergency vehicle light bar warning light assembly suitable for mounting on the roof of an emergency vehicle and incorporating an encapsulated power supply in accordance with the present invention.

The light bar 10 comprises a top plate 12 and a base 14. Preferably, both the top plate 12 and the base 14 are metallic elongated structures manufactured by an extrusion process. Thus, the contour of the cross-section of each of these members as shown in FIG. 6 is generally uniform throughout the axial extent thereof.

The base 14 includes two opposed top mounting tracks 16, 18 that extend the length of the base 14. The top mounting tracks 16, 18 are dimensioned and configured for receiving protruding feet 24 that are integrally molded parts of the power supply housing 22 for a power supply 20. A slot 26 is provided at each axial extremity of each of the upper plate 12 and base 14. Each slot 26 is dimensioned and configured for receiving the protrusions 28 of a longitudinally extending lens 30. Thus, a first longitudinally extending lens 30 is disposed at one axial extremity of the light bar 10 and a second longitudinally extending lens 30 is disposed at the other axial extremity of the light bar 10.

The power supply housing 20 of the power supply 20 is preferably a box-like structure manufactured of a high strength plastic capable of retaining strength and physical integrity at elevated temperatures. One suitable material is DuPont ZYTEL #8018 plastic. Protruding feet 24 which are generally complementary with the top mounting tracks 16, 18 integrally project from opposite lower sides of the power supply housing 22. The protruding feet 24 are slideably received in the top mounting tracks 16, 18 to mount each power supply 20 to the base 14.

The power supply 20 includes a printed circuit (PC) board 32 on which various components are mounted including a power transistor 34. The construction of the power supply 24 may be referred to as a sandwich construction that includes the printed circuit (PC) board 32 disposed in spaced parallel relationship to the upper surface 36 of the power supply housing 22 as well as to a heat sink plate 38. Preferably, the heat sink plate 38 is insert molded into the power supply housing 22 with an entire planar face thereof in planar contact with the generally planar member that is part of the light bar 10 for maximum heat dissipation. The sandwich concept allows the printed circuit (PC) board 32 and the heat sink plate 38 to pinch the power supply housing 22 between them to create a sealing effect. After initial assembly of the power supply housing 22, it is ordinarily inverted from the position shown in FIG. 1, and filled with a potting compound.

Figure 7:
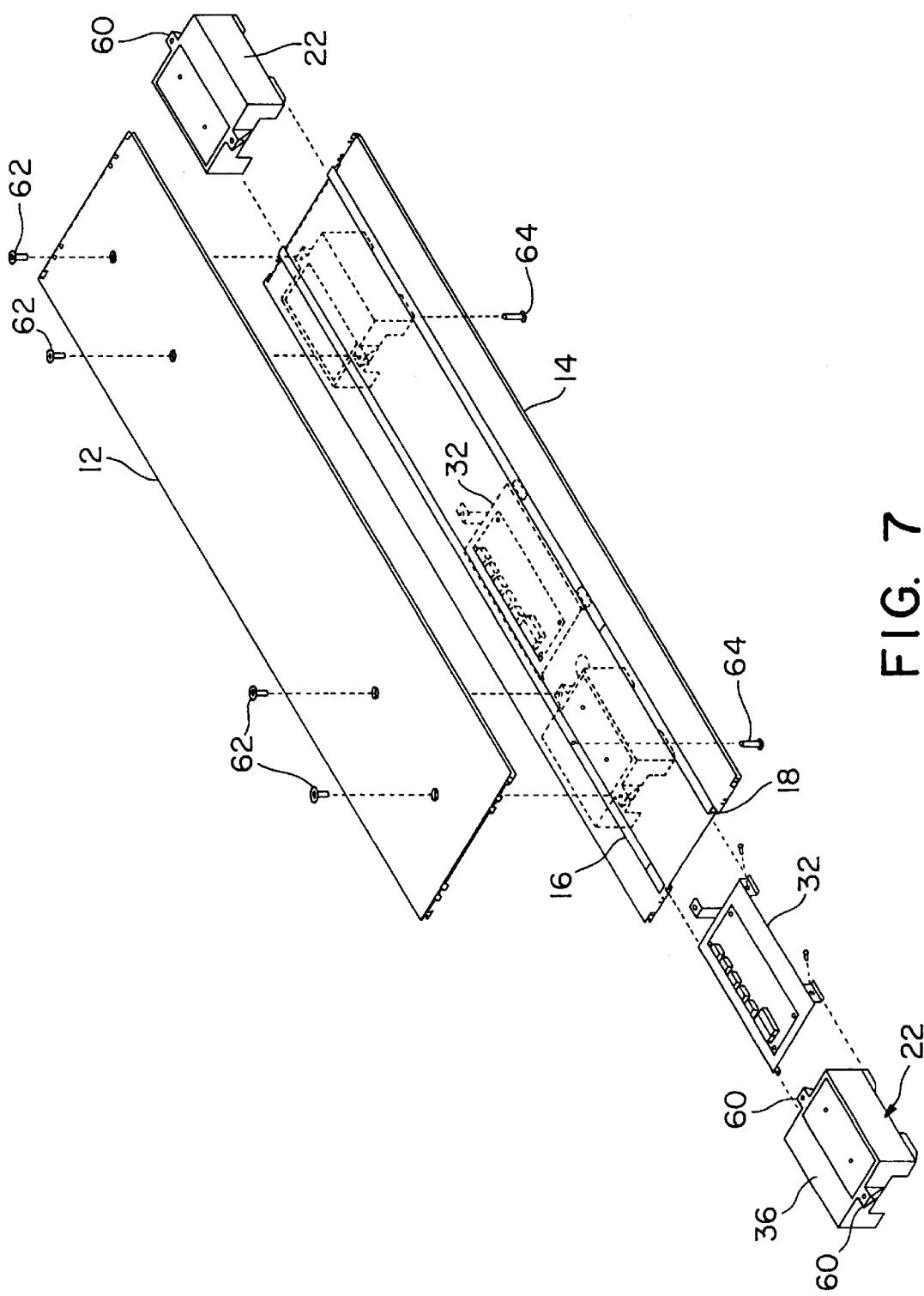
FIG. 7 is an exploded view of the components in the center section of the warning light assembly shown in FIG. 6, that illustrates in solid lines two encapsulated power supplies, including an associated printed circuit board and in dashed lines sequential positions of these same components during installation.

As best seen in FIGS. 6 and 7, the power transistor 34 mounted on the printed circuit (PC) board 32 is disposed in registered relationship with an opening 40 in the upper surface 36 of the power supply housing 22. The lower face of the upper surface 36 of the power supply housing 22 may be provided with a standoff 42 to strengthen the power supply housing 22. Attached to the lower (as viewed in FIG. 3) face of the heat sink plate 38, are three mounting studs 46. Such mounting studs 46 are preferably PEM® self-clinching studs manufactured by PEM® Fastening Systems (a PennEngineering company). Such devices are described more fully at www.penn-eng.com. For maximum heat transfer, the mounting studs 46 are manufactured of metal such as aluminum alloy. Some embodiments of the apparatus of the present invention may utilize a plastic construction. The mounting studs 46 cooperate with respective nuts 48 to draw the assembly together for good thermal conduction as best shown in FIG. 6.

A thermal conductive gasket 50 is sized to fit within the opening 40 in the surface 36 of the power supply housing 22 in face-to-face abutting relationship with both the heat sink plate 38 and the top surface of the power transistor 34. The gasket 50 is preferably a CHO-THERM gasket manufactured by Chomerics, Division of Parker Hannifin Corporation (www.chomerics.com), which provides good heat conduction between surfaces abutting opposite sides of the CHO-THERM gasket. The "footprint" of the gasket 50 is shown on the heat sink plate 38 in FIG. 3. The gasket 50 preferably has an adhesive side that is affixed to the heat sink plate 38.

Figure 3:
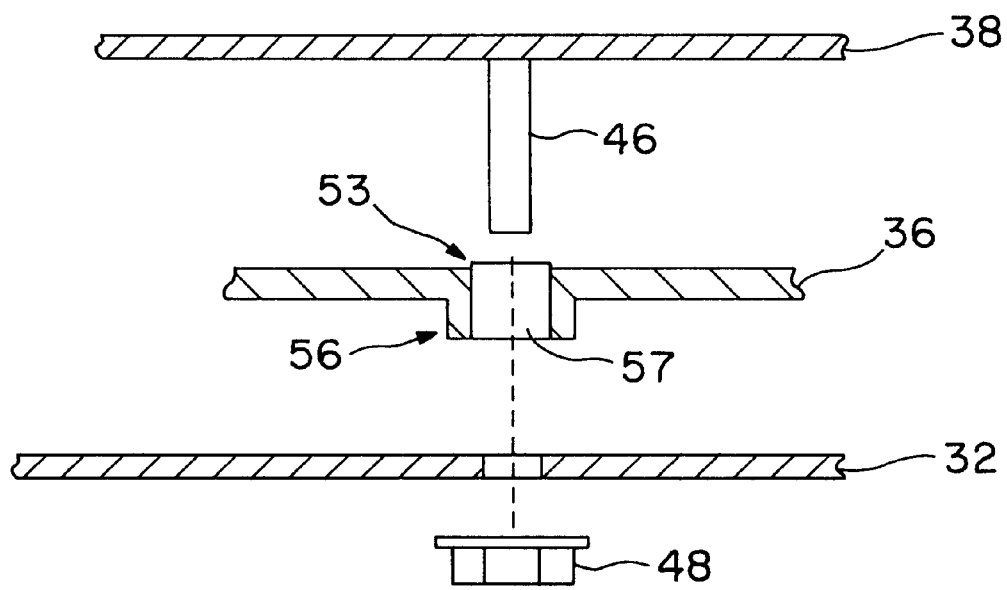
Figure 4:
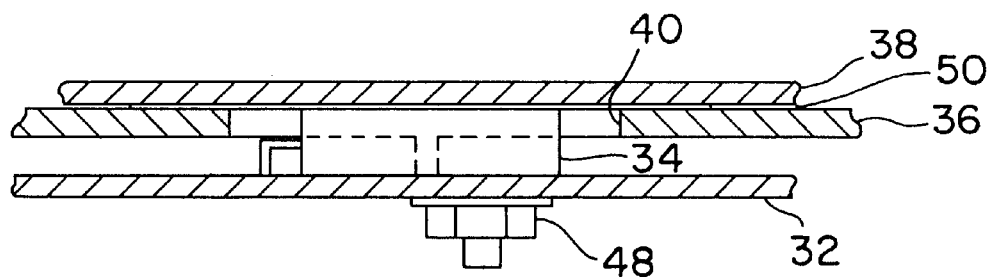
FIGS. 4 and 5 are respectively assembled cross-sectional and exploded views taken along a vertical plane that show the physical relationship between one part of the mutually parallel circuit board disposed within the power supply and one part of the planar heat sink that extends, in the preferred embodiment, along the top of the power supply.
Figure 5:
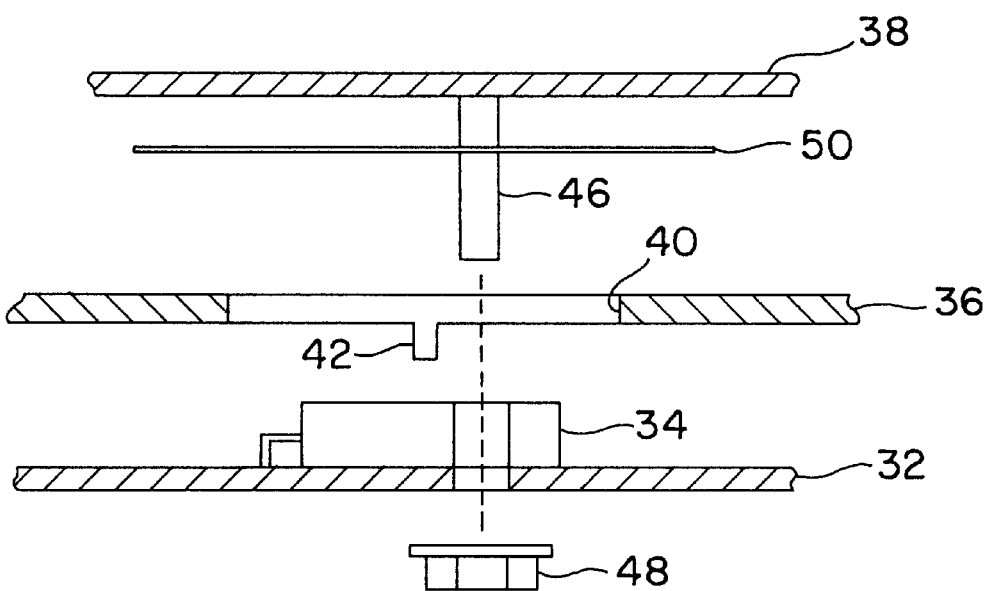

In addition, to the physical connection provided by the mounting stud 46 and nut 48 extending through the power transistor 34, there is also another connection between the heat sink plate 38 and the printed circuit (PC) board as best seen in FIG. 3. This connection is shown in still more detail in FIGS. 4 and 5. A lip seal 53 projects toward the heat sink plate 38 from the outside surface of the power supply housing surrounding the through hole 57. This lip seal 53 is approximately 0.015" high and configured to deform or crush in response to tension exerted on the mounting stud 46 by the nut 48. A plastic standoff 56 is disposed intermediate the heat sink plate 38 and the printed circuit (PC) board 32. It will be understood that the plastic standoff 56 acts as a spacer to preclude any possible damage to the discrete components located on the printed circuit (PC) board 32 as the respective nuts 48 are tightened on the respective mounting studs 46.

Figure 1:
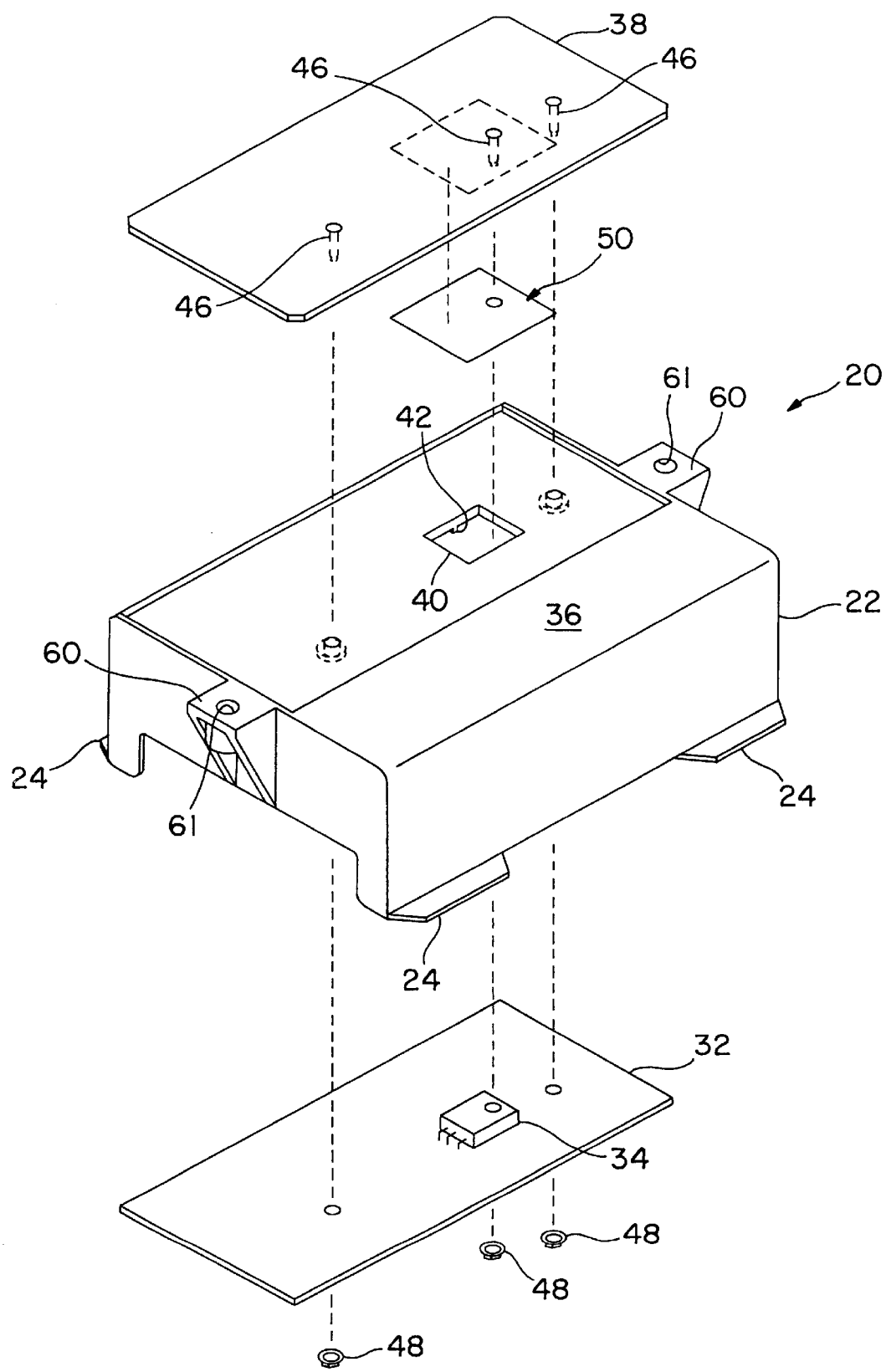
FIG. 1 is an exploded view of a power supply in accordance with the present invention.
Figure 2:
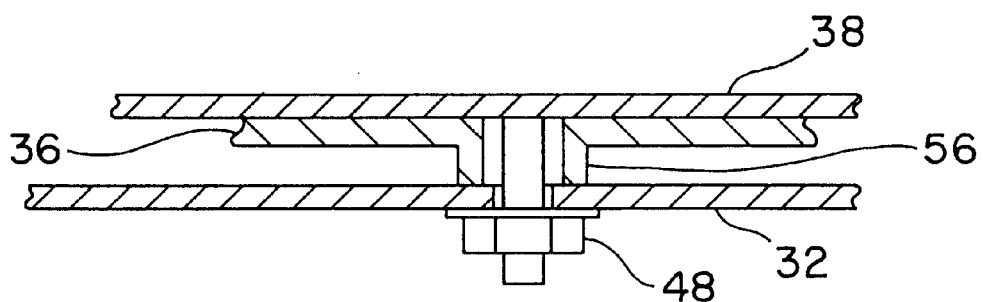
FIGS. 2 and 3 are respectively assembled cross-sectional and exploded views taken along a vertical plane that show the physical relationship between one part of the mutually parallel printed circuit board disposed within the power supply and one part of the planar heat sink that extends, in the preferred embodiment, along the top of the power supply.

As described above, the lower portion of power supply 20 is provided with two laterally spaced pairs of longitudinally spaced, integrally protruding feet 24 that engage the top mounting tracks 16, 18. Wing-like platforms 60 integrally project longitudinally from upper central locations of the housing. The platforms include openings 61. As best seen in FIG. 2, the power supply 20 is further secured between the top plate 12 and the lower generally planar base 14 by screws 62 that engage openings 61 and fasteners 64 which engage the underside of the feet 24.

While a preferred embodiment of the foregoing invention has been set forth for purposes of illustration, the foregoing description should not be deemed a limitation of the invention herein. Accordingly, various modifications, adaptations and alternatives may occur to a person of ordinary skill in the art, without departing from the spirit or scope of the present invention.

What is claimed is:

1. A power supply comprising:
   a heat generating component mounted to a PC board;
   a housing with a plurality of walls having inside and outside surfaces, said walls defining an interior space, one of said walls defining an opening connecting said inside and outside surfaces and communicating with said interior space;

a generally planar heat sink plate; and a fastener, wherein said heat sink plate is mounted to the outside surface of the wall defining said opening, the heat generating component is positioned in said interior space such that a portion of said heat generating component extends into said opening, said fastener extending through said heat sink plate, said heat generating component and said PC board to secure said heat generating component in thermally conductive relationship to said heat sink plate, whereby heat generated by said heat generating component is transferred from said interior space to said heat sink plate.

2. The power supply of claim 1, wherein said housing is formed of plastic and said heat sink plate comprises a metal plate.

3. The power supply of claim 1, comprising a heat transmissive gasket between said heat generating component and said heat sink plate, said heat transmissive gasket configured to extend beyond said opening and be compressed between the outside surface of the wall defining the opening and the heat sink around said opening.

4. The power supply of claim 1, wherein the wall defining said opening comprises a standoff arranged to bear against said PC board to maintain a predetermined spacing between said PC board and said heat sink plate.

5. A power supply comprising:

a heat generating component mounted to a PC board;

a plastic housing surrounding the PC board, said housing comprising walls having inside and outside surfaces and defining an interior space, one of said walls defining an opening;

a metallic heat sink in the form of a flat metal plate mounted to the outside surface of the wall defining said opening, wherein said heat generating component extends into said opening and is secured in thermally conductive relation to said heat sink.

6. A power supply comprising:

a heat generating component mounted to a PC board;

a plastic housing surrounding the PC board, said housing comprising walls having inside and outside surfaces and defining an interior space, one of said walls defining an opening;

a fastener; and a metallic heat sink in the form of a flat metal plate mounted to the outside surface of the wall defining said opening, wherein said PC board is generally parallel to the wall defining said opening and said heat generating component is compressed between said PC board and said metallic heat sink by a fastener extending through said metallic heat sink, said heat generating component and said PC board.

7. The power supply of claim 5, wherein the inside surface of the wall defining the opening comprises a standoff arranged to maintain a predetermined spacing between the PC board and the metallic heat sink.

8. The power supply of claim 5, comprising a thermally conductive gasket arranged between the outside surface of the wall defining the opening and the metallic heat sink, said thermally conductive gasket covering said opening to form a layer between said heat generating component and said metallic heat sink.

9. The power supply of claim 5, wherein said fastener comprises a threaded stud engaged by a threaded nut which bears against said PC board.

10. The power supply of claim 5, wherein said fastener is made of metal.

11. The power supply of claim 5, comprising a plurality of fasteners extending through the wall defining the opening to secure the PC board to the metallic heat sink, wherein the wall defining the opening further defines one or more fastener openings, the outside surface of the wall comprising a lip seal surrounding each said fastener opening and the inside surface of the wall comprising a standoff adjacent each of said fastener openings, said fasteners drawing the PC board toward the metallic heat sink such that said metallic heat sink crushes said lip seal and said standoffs maintain a predetermined spacing between the inside surface of the wall and the PC board.

12. A power supply comprising:

a heat generating component mounted to a PC board;

a plastic housing defining an interior space within walls having inside and outside surfaces, one of said walls defining a heat transfer opening;

a metallic heat sink having top and bottom surfaces;

a thermally conductive gasket; and a fastener, wherein said PC board is arranged in said interior space with said heat generating component aligned with and extending into said heat transfer opening, said metallic heat sink is positioned with said bottom surface against the outside surface of the wall defining the heat transfer opening and said gasket is captured between the bottom surface of the metallic heat sink and the outside surface of the wall defining the heat transfer opening in a region surrounding the heat transfer opening, said fastener passing through said heat generating component and said PC board to draw the PC board toward the metallic heat sink and compress the gasket between the bottom surface of the metallic heat sink and the outside surface of the wall defining the heat transfer opening, whereby the metallic heat sink is maintained in sealed relationship to the housing and the heat generating component is maintained in thermally conductive relationship to said metallic heat sink.

13. The power supply of claim 12, wherein said metallic heat sink is a plate having planar top and bottom surfaces.

14. The power supply of claim 12, wherein said heat generating component is compressed between said PC board and said metallic heat sink.

15. The power supply of claim 12, comprising a plurality of fasteners extending through the wall defining the heat transfer opening to secure the PC board to the metallic heat sink with the wall defining the heat transfer opening sandwiched between said PC board and said metallic heat sink, wherein the wall defining the heat transfer opening further defines one or more fastener openings, the outside surface of said wall having a lip seal surrounding each said fastener opening and the inside surface of said wall having a standoff adjacent each of said fastener openings, said fasteners drawing the PC board toward the metallic heat sink such that said metallic heat sink crushes said lip seal and said standoffs maintain a predetermined spacing between the inside surface of the wall and the PC board.

* * * * *

UNITED STATES PATENT AND TRADEMARK OFFICE
CERTIFICATE OF CORRECTION

PATENT NO. : 6,583,988 B1
DATED : June 24, 2003
INVENTOR(S) : Lyons et al.

It is certified that error appears in the above-identified patent and that said Letters Patent is hereby corrected as shown below:

Column 5,
Lines 31-42, delete claim 5, and replace with:

-- 5. A power supply comprising:
    a heat generating component mounted to a PC board;
    a plastic housing surrounding the PC board, said housing comprising walls having inside and outside surfaces and defining an interior space, one of said walls defining an opening;
    a fastener; and
    a metallic heat sink in the form of a flat metal plate mounted to the outside surface of the wall defining said opening,
    wherein said PC board is generally parallel to the wall defining said opening and said heat generating component is compressed between said PC board and said metallic heat sink by a fastener extending through said metallic heat sink, said heat generating component and said PC board. --

Signed and Sealed this

Twenty-seventh Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,583,988 B1
DATED : June 24, 2003
INVENTOR(S) : Lyons et al.

It is certified that error appears in the above-identified patent and that said Letters Patent is hereby corrected as shown below:

Column 5,
Lines 31-42, delete claim 5, and replace with:

-- 5. A power supply comprising:
    a heat generating component mounted to a PC board;
    a plastic housing surrounding the PC board, said housing comprising walls having inside and outside surfaces and defining an interior space, one of said walls defining an opening;
    a fastener; and
    a metallic heat sink in the form of a flat metal plate mounted to the outside surface of the wall defining said opening,
    wherein said PC board is generally parallel to the wall defining said opening and said heat generating component is compressed between said PC board and said metallic heat sink by a fastener extending through said metallic heat sink, said heat generating component and said PC board. --
Lines 43-58, delete claim 6, and replace it with:
-- 6. The power supply of claim 5, wherein the outside surface of the wall defining said opening defines a recess configured to receive said flat metal plate. --

This certificate supersedes Certificate of Correction issued July 27, 2004.

Signed and Sealed this

Twenty-second Day of March, 2005

JON W. DUDAS
*Director of the United States Patent and Trademark Office*